(12) United States Patent
Pelka

(10) Patent No.: US 6,744,960 B2
(45) Date of Patent: Jun. 1, 2004

(54) LIGHTING APPARATUS HAVING QUANTUM DOT LAYER

(75) Inventor: David G. Pelka, Los Angeles, CA (US)

(73) Assignee: Teledyne Lighting and Display Products, Inc., Hawthorne, CA (US)

( * ) Notice: Subject to any disclaimer, the term of this patent is extended or adjusted under 35 U.S.C. 154(b) by 14 days.

(21) Appl. No.: 09/800,067

(22) Filed: Mar. 6, 2001

(65) Prior Publication Data

US 2002/0018632 A1 Feb. 14, 2002

Related U.S. Application Data

(60) Provisional application No. 60/188,924, filed on Mar. 6, 2000.

(51) Int. Cl.$^7$ .............................. G02B 6/10; F21V 27/00
(52) U.S. Cl. ...................... 385/130; 385/129; 385/131; 385/141; 385/122; 385/14; 385/901; 362/259; 362/301
(58) Field of Search ....................... 385/14, 129, 130, 385/131, 132, 141, 122, 901; 362/581, 553, 259, 301

(56) References Cited

U.S. PATENT DOCUMENTS

| | | | |
|---|---|---|---|
| 1,153,446 A | 9/1915 | Roffy | 362/302 |
| 1,235,275 A | 7/1917 | Wood | 362/298 |
| 1,748,057 A | 2/1930 | Arbuckle | 362/298 |
| 1,998,967 A | 4/1935 | Raynolds | 362/298 |
| 2,120,836 A | 6/1938 | Grimes | 362/302 |
| 2,255,819 A | 9/1941 | Salani | 362/303 |
| 3,821,590 A | 6/1974 | Kosman et al. | 313/499 |
| 3,890,497 A | 6/1975 | Rush | 240/7.55 |
| 3,934,148 A | 1/1976 | Collins | 362/302 X |
| 3,957,351 A | 5/1976 | Stockwell | 40/130 X |
| 4,114,592 A | 9/1978 | Winston | 126/270 |
| 4,128,332 A | 12/1978 | Rowe | 355/67 |

(List continued on next page.)

FOREIGN PATENT DOCUMENTS

| | | | |
|---|---|---|---|
| EP | 0 660 648 A1 | 6/1995 | ........... H05B/33/08 |
| EP | 0 733 850 A2 | 9/1996 | ............ F21S/1/14 |
| GB | 2131589 | 6/1984 | ............ G09F/13/00 |
| JP | 62175702 A | 8/1987 | ............ G02B/6/00 |
| JP | 63110403 A | 5/1988 | ............ G02B/6/10 |
| WO | WO 87/04230 | 7/1987 | ............ 385/147 X |
| WO | WO 98/21917 | 5/1998 | ............ 385/147 X |
| WO | WO 98/26212 | 6/1998 | ............ F21V/8/00 |
| WO | WO 99/06759 | 2/1999 | ............ F21P/1/02 |
| WO | WO 00/54340 | 9/2000 | ............ 385/147 X |

OTHER PUBLICATIONS

Olga I. Micic et al., *Highly efficient band–edge emission from InP quantum dots,* Appl. Phys. Letter, vol. 68, No. 22, May 27, 1996, pp. 3150–3152.

K. H. Schmidt et al., *Size quantization effects in InAs self–assembled quantum dots,* Appl. Phys. Letter, vol. 70, No. 13, Mar. 31, 1997, pp. 1727–1729.

T. Tokizaki et al., *Linear and nonlinear optical properties of CdSe microcystallites in glasses,* Journal of Crystal Growth, Vol 117, Feb. 1992, pp. 603–607.

N. C. Greenham et al., *Charge separation and transport in conjugated–polymer/semiconductor–nanocrystal composites studied by photoluminescence quenching and photoconductivity,* Physical Review B, vol. 54, No. 24, Dec. 15, 1996, pp. 17 628–17 637.

(List continued on next page.)

*Primary Examiner*—Brian Healy
(74) *Attorney, Agent, or Firm*—Kirkpatrick & Lockhart LLP

(57) ABSTRACT

A fluorescent structure comprising a plurality of quantum dots that radiate emission in response to optical pumping. These quantum dots are disposed in relation to a waveguide so as to be able to propagate this emission through the waveguide. Preferably, the fluorescent structure comprises a layer of quantum dots sandwiched between two layers, at least one layer being optically transmissive to the pump radiate and at least one of the layers being optically transmissive to emission from the quantum dots.

76 Claims, 4 Drawing Sheets

U.S. PATENT DOCUMENTS

| | | | | |
|---|---|---|---|---|
| 4,130,107 | A | 12/1978 | Rabl et al. | 126/270 |
| 4,149,902 | A | 4/1979 | Mauer et al. | 136/89 |
| 4,210,954 | A | 7/1980 | Laser | 126/439 |
| 4,230,095 | A | 10/1980 | Winston | 136/259 |
| 4,237,332 | A | 12/1980 | Winston | 385/147 X |
| 4,240,692 | A | 12/1980 | Winston | 362/240 |
| 4,254,453 | A | 3/1981 | Mouyard et al. | 362/240 |
| 4,262,206 | A | 4/1981 | Viehmann | 250/483 |
| 4,274,127 | A | 6/1981 | Beck et al. | 362/72 |
| 4,292,959 | A | 10/1981 | Coburn, Jr. | 126/438 |
| 4,320,442 | A | 3/1982 | McCamy | 362/301 |
| 4,359,265 | A | 11/1982 | Winston | 126/438 |
| 4,379,613 | A | 4/1983 | Coburn | 385/147 X |
| 4,387,961 | A | 6/1983 | Winston | 126/439 |
| 4,392,750 | A | 7/1983 | Mettler | 368/228 |
| 4,422,135 | A | 12/1983 | McCamy | 362/346 |
| 4,492,778 | A | 1/1985 | Claussen et al. | 533/137 |
| 4,561,043 | A | 12/1985 | Thompson | 362/32 |
| 4,661,649 | A | 4/1987 | Reisfeld et al. | 136/247 |
| 4,733,332 | A | 3/1988 | Yamashita et al. | 362/32 |
| 4,739,152 | A | 4/1988 | Downs | 219/347 |
| 4,755,916 | A | 7/1988 | Collins | 362/236 |
| 4,865,417 | A | 9/1989 | Yamamoto Naohiro | 385/123 X |
| 4,941,723 | A | 7/1990 | Sasada | 385/147 X |
| 4,965,876 | A | 10/1990 | Földi et al. | 362/247 |
| 4,985,809 | A | 1/1991 | Matsui et al. | 362/31 |
| 5,040,098 | A | 8/1991 | Tanaka et al. | 362/31 |
| 5,095,099 | A | 3/1992 | Parkinson et al. | 534/15 |
| 5,128,846 | A | 7/1992 | Mills et al. | 362/224 |
| 5,184,114 | A | 2/1993 | Brown | 340/701 |
| 5,227,773 | A | 7/1993 | Wu et al. | 340/815.07 |
| 5,260,957 | A * | 11/1993 | Hakimi et al. | 372/39 |
| 5,271,077 | A | 12/1993 | Brockman et al. | 385/31 |
| 5,332,910 | A * | 7/1994 | Haraguchi et al. | 257/13 |
| 5,410,453 | A | 4/1995 | Ruskouski | 362/20 |
| 5,432,876 | A | 7/1995 | Appeldorn et al. | 385/31 |
| 5,481,637 | A | 1/1996 | Whitehead | 385/125 |
| 5,502,623 | A | 3/1996 | Brotz | 362/99 |
| 5,548,676 | A | 8/1996 | Savage, Jr. | 385/92 |
| 5,586,013 | A | 12/1996 | Winston et al. | 362/347 |
| 5,606,163 | A | 2/1997 | Huston et al. | 250/337 |
| 5,659,643 | A | 8/1997 | Appeldorn et al. | 385/31 |
| 5,677,972 | A | 10/1997 | Popovich | 385/31 |
| 5,678,913 | A | 10/1997 | Ishimaru et al. | 362/26 |
| 5,685,634 | A | 11/1997 | Mulligan | 362/237 |
| 5,704,708 | A | 1/1998 | Barson et al. | 362/238 |
| 5,709,453 | A | 1/1998 | Krent et al. | 362/80 |
| 5,721,795 | A | 2/1998 | Pelka | 385/37 |
| 5,757,557 | A | 5/1998 | Medvedev et al. | 359/708 |
| 5,779,351 | A | 7/1998 | Erickson et al. | 362/241 |
| 5,806,955 | A | 9/1998 | Parkyn, Jr. et al. | 362/31 |
| 5,813,753 | A | 9/1998 | Vriens et al. | 362/293 |
| 5,816,693 | A | 10/1998 | Winston et al. | 362/347 |
| 5,878,070 | A * | 3/1999 | Ho et al. | 372/92 |
| 5,881,200 | A | 3/1999 | Burt | 385/142 |
| 5,924,788 | A | 7/1999 | Parkyn, Jr. | 362/329 |
| 5,949,581 | A | 9/1999 | Kurtenbach et al. | 359/621 |
| 5,980,063 | A | 11/1999 | Ford et al. | 362/186 |
| 5,982,969 | A | 11/1999 | Sugiyama et al. | 385/123 |
| 5,997,155 | A | 12/1999 | Ducharme et al. | 362/298 |
| 6,005,707 | A * | 12/1999 | Berggren et al. | 359/322 |
| 6,031,859 | A * | 2/2000 | Nambu | 372/50 |
| 6,095,673 | A | 8/2000 | Goto et al. | 362/582 |
| 6,103,006 | A | 8/2000 | DiPietro | 106/493 |
| 6,123,442 | A | 9/2000 | Freier et al. | 362/559 |
| 6,257,737 | B1 | 7/2001 | Marshall et al. | 362/231 |
| 6,294,794 | B1 * | 9/2001 | Yoshimura et al. | 257/14 |
| 6,422,712 | B1 | 7/2002 | Nousiainen et al. | 362/31 |
| 6,577,441 | B2 * | 6/2003 | Carlson | 359/342 |
| 2002/0127224 | A1 | 9/2002 | Chen | |
| 2003/0044114 | A1 * | 3/2003 | Pelka | |

OTHER PUBLICATIONS

Keith Barnham et al., *Quantum–dot concentrator and thermodynamic model for the global redshift*, Applied Physics Letter, vol. 76, No. 9, pp. 1197–1199.

David Rotman, *Quantom Dot Com*, Technology Review, Jan./Feb. 2000, pp. 50–57.

Arl Rabl et al., *Ideal concentrators for finite sources and restricted exit angles*, Applied Optics, vol. 15, No. 11, Nov. 1976, pp. 58–61.

D. Jenkins et al., *Integral design method for nonimaging concentrators*, J. Opt. Soc. Am. A, vol. 13, No. 10, Oct. 1996, pp2106–2116.

D. Jenkins et al., *Tailored Reflectors for Illumination*, Applied Optics, vol. 35, No. 10, Apr. 1996, pp. 1669–1672.

G.E. Jabbour et al., *Aluminum Composite Cathodes A new Method for the Fabrication of Efficient and Bright Organic Light–emitting Devices*, Optics & Photonics News, Apr. 1999, pp. 25–27.

Hewlett Packard catalog, Super Flux LEDs Technical Data, (date unknown), 3 pages.

I.M. Bassett et al., *The collection of diffuse light onto an extended absorber*, Reprinted from Optical and Quantum Electronics, vol. 10, 1978, 2 pages.

Jose L. Álvarez et al., Paper on *RXI concentrator for 1000X photovoltaic energy conversion*.

Juan C. Minano et al., Paper on *New non–imaging desings: The RX and the RXI concentrators*.

LumiLeds Product Showcase http:/www.lumileds.com/products.html Oct. 11, 2000, 4 pages.

LumiLeds Red LED Rail Designer Kit, (date unknown), 5 pages.

R. Winston, *Selected Papers in Nonimaging Optics*, SPIE, vol. MS106, 1995.

Slides on third party presentation at Monterey Conference, date unknown, 10 pages.

Tivoli escort lights, 1989Ó, 10 pages.

Tivoli the light fantastic, (date unknown), 4 pages.

W.T. Welford et al., *High Collection Nonimaging Optics*, Academic Press, 1989. (Need to Obtain Copies).

W.T. Welford et al., Paper on *The Optics of Nonimaging Concentrators Light and Solar Energy*, 1978, pp. 29–32.

William A. Parkyn, *Segmented illumination lenses for step-lighting and wall–washing*, (date unknown), 8 pages.

William A. Parkyn, *The design of illuminaton lenses via extrinsic differential geometry*, (date unknown), 9 pages.

\* cited by examiner

LIGHTING APPARATUS HAVING QUANTUM DOT LAYER

PRIORITY APPLICATION

This application claims priority under 35 U.S.C. §119(e) from U.S. Provisional Patent Application Ser. No. 60/188,924, filed Mar. 6, 2000.

FIELD OF THE INVENTION

The present invention relates to fluorescence, and more specifically, to structures comprising material that fluoresces when exposed to light.

BACKGROUND OF THE INVENTION

Organic fluorescent dyes have been employed in structures comprising a plate of a material that is transparent to light. The material has an organic fluorescent dye distributed within its volume. The plate has a top surface and is surrounded by edges. The top surface of the transparent plate is oriented to receive the light. Light incident on this top surface penetrates into the plate and is absorbed by the organic fluorescent dye which in turn emits longer wavelength light having a narrow wavelength distribution. The light emitted by the fluorescent dye propagates through the plate to its edges. The plate is preferably thin so as to provide a large surface area for collecting light and has narrow edges where the light emitted from the fluorescent dye exits the plate. Large amounts of light can therefore be collected and concentrated into a smaller region. One disadvantage of such organic-based structures is that they have a short lifetime, lasting typically about 1–4 years. The organic fluorescent dyes contained within the structure decompose upon extended exposure to ultraviolet (UV) light, which, for instance, is abundant in sunlight. Thus, there is a need for a structure for collecting light and converting it into high intensity narrow band illumination that is not rendered inoperative by UV light.

SUMMARY OF THE INVENTION

In one aspect of the invention, an apparatus comprises a layer of quantum dots that emits light in response to exposure to pump radiation and a waveguide which receives and guides light emitted by the layer of quantum dots.

In another aspect of the invention, a waveguide has a substantial number of quantum dots which emit light in response to pump radiation. The quantum dots are disposed in relation to the waveguide such that light emitted by the quantum dots is captured by the waveguide and guided therein.

In yet another aspect of the invention, a method of illumination comprises illuminating quantum dots disposed over a relatively large area with pumping radiation. These quantum dots are used to emit light in response to the pumping radiation. Light emitted by the quantum dots is collected and used to illuminate a relatively small surface area.

DETAILED DESCRIPTION OF THE PREFERRED EMBODIMENT

Figure 1A:
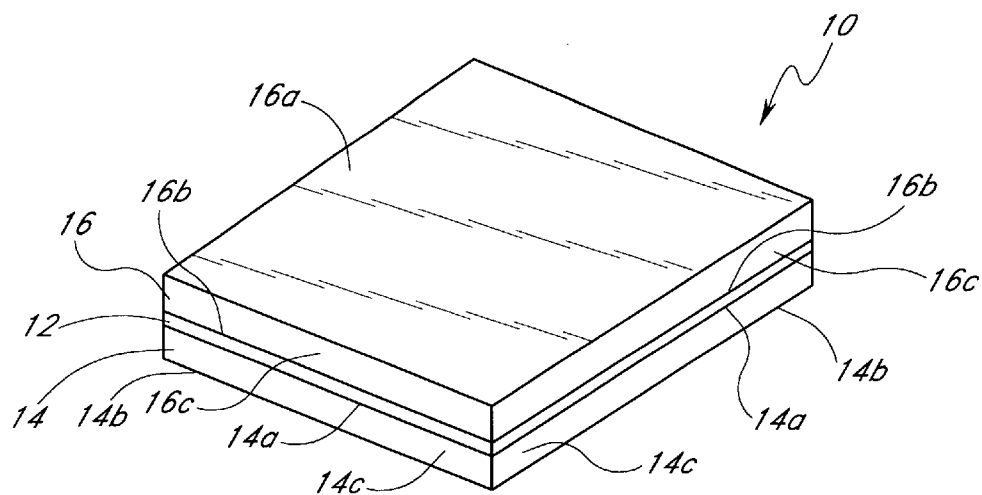
FIG. 1A is a perspective view of a fluorescent structure of one embodiment in the present invention.
Figure 1B:
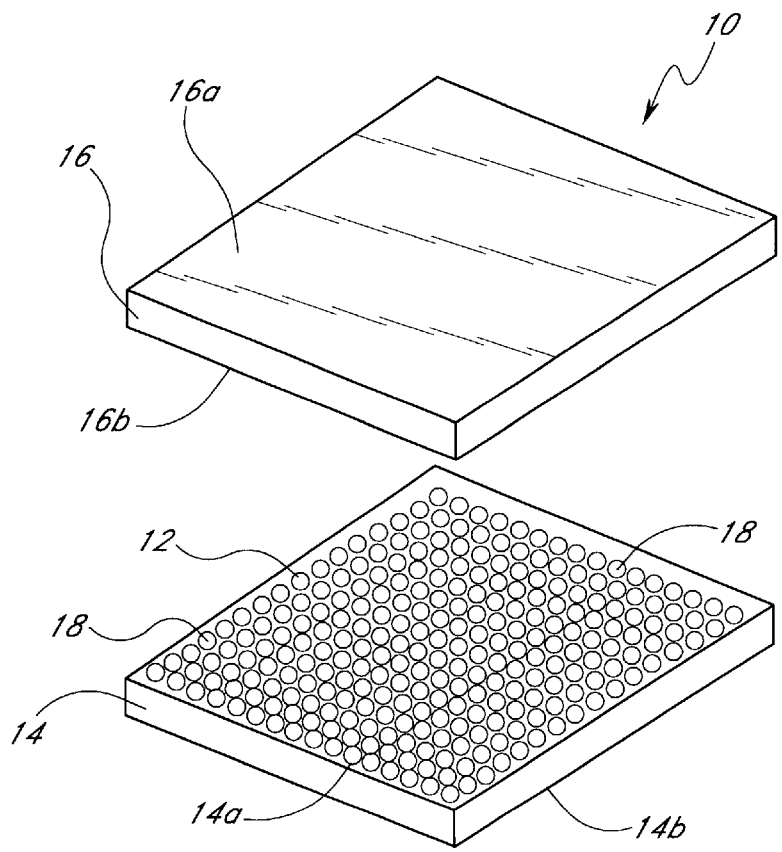
FIG. 1B shows an exploded view of the fluorescent structure depicted in FIG. 1A.
Figure 2:
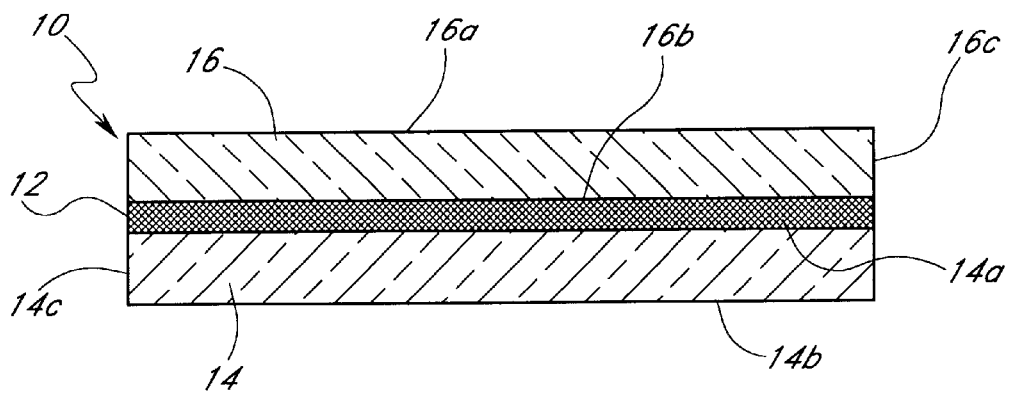
FIG. 2 is a cross-section of the fluorescent structure shown in FIGS. 1A–1B.

As depicted in FIGS. 1A–1B and 2, a fluorescent structure 10 comprises a layer of quantum dots 12 sandwiched between a base layer 14 and a protective layer 16. The dots emit light at a particular wavelength in response to exposure to light, particularly sunlight. The base layer 14 has a top and a bottom surface 14a, 14b as well as edges 14c. The bottom surface 14b of the base layer 14 forms the bottom of the fluorescent structure 10. The protective layer 16 also has a top and a bottom surface 16a, 16b as well as edges 16c. The top surface 16a forms the top surface of the fluorescent structure 10. In the embodiment shown, the protective layer 16, and the base layer 14 are both transmissive to light of the emission wavelength of the quantum dots. Each layer 14, 16 has an index of refraction, n, greater than unity at that wavelength (e.g., approximately 1.5). The base layer 14 and the protective layer 16 may be rigid, but are preferably formed of thin, flexible film so that the fluorescent structure 10 can readily be applied to a curved or irregular surface or bent into a desired shape. The base layer 14 and the protective layer 16 may comprise, for example, a polymeric material such as plastic or silicone. The base layer 14 is sufficiently thick to support the layer of quantum dots 12 when the protective layer 16 is in place. The layer of quantum dots 12 comprises an array of individual quantum dots 18 spread across the top surface 14a of the base layer 14. Preferably, the quantum dots 18 are uniformly distributed over this top surface 14a in a layer sufficiently thick so as to absorb pump radiation incident thereon. The quantum dots themselves are preferably between about 2 to 10 nanometers (nm) in size. In the preferred embodiment, the structure 10, which includes the base layer 14, the layer of quantum dots 12, and the protective layer 16, is preferably about 500 to 1000 micrometers ($\mu$m) thick. The length and width of the fluorescent structure 10, however, is significantly larger, for example, the length or width may be about ½ inch (in.) to ten or more feet (ft.).

Quantum dots 18 such as in the layer of quantum dots 12 are well known in the art and are available from numerous sources. One kind of quantum dots, for example, is sold under the tradename Qdot® and is manufactured and distributed by Quantum Dot Corp. of Palo Alto, Calif.

Figure 3:
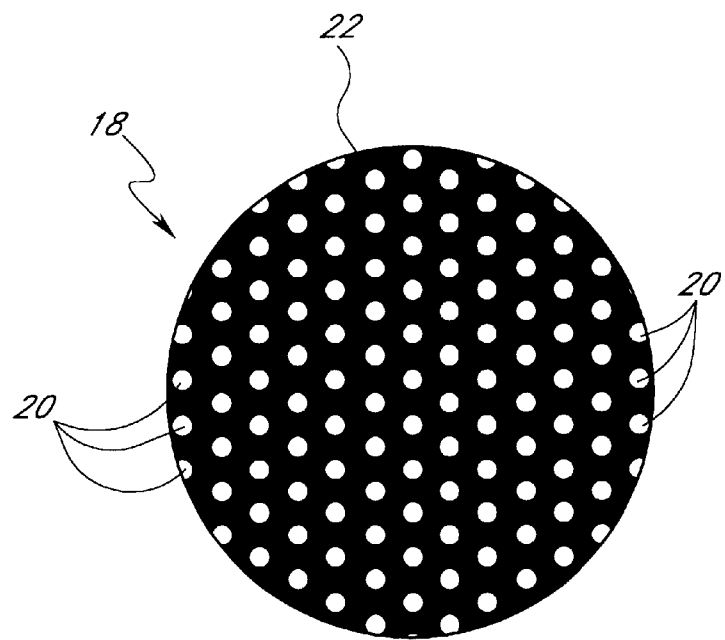
FIG. 3 is a schematic drawing of a single quantum dot that is contained in the fluorescent structure of FIGS. 1A–1B and 2.

As depicted in FIG. 3, a single quantum dot 18 comprises a small group of atoms 20 that form an individual particle 22. These quantum dots 18 may comprise various materials including semiconductors such as zinc selenide (ZnSe), cadmium selenide (CdSe), cadmium sulfide (CdS), indium arsenide (InAs), and indium phosphide (InP). Another material that may suitably be employed is titanium dioxide (TiO$_2$). The size of the particle 22, i.e., the quantum dot 18, may range from about 2 to 10 nm. Since the size of these particles 22 is so small, quantum physics governs many of the electrical and optical properties of the quantum dot 18. One such result of the application of quantum mechanics to the quantum dot 18 is that quantum dots absorb a broad spectrum of optical wavelengths and re-emit radiation having a wavelength that is longer than the wavelength of the absorbed light. The wavelength of the emitted light is governed by the size of the quantum dot 18. For example, CdSe quantum dots 5.0 nm in diameter emit radiation having a narrow spectral distribution centered about 625 nm while quantum dots 18 comprising CdSe 2.2 nm in size emit light having a center wavelength of about 500 nm. Semiconductor quantum dots comprising CdSe, InP, and InAs, can emit radiation having center wavelengths in the range between 400 nm to about 1.5 $\mu$m. Titanium dioxide $TiO_2$ also emits in this range. The linewidth of the emission, i.e., full-width half-maximum (FWHM), for these semiconductor materials may range from about 20 to 30 nm. To produce this narrowband emission, quantum dots 18 simply need to absorb light having wavelengths shorter than the wavelength of the light emitted by the dots. For example, for 5.0 nm diameter CdSe quantum dots light having wavelengths shorter than about 625 nm is absorbed to produce emission at about 625 nm while for 2.2 nm quantum dots comprising CdSe light having wavelengths smaller than about 500 nm is absorbed and re-emitted at about 500 nm. In practice, however, the excitation or pump radiation is at least about 50 nanometers shorter than the emitted radiation. These and other properties of quantum dots are well known and are described in by David Rotman in "Quantum Dot Com," *Technology Review*, January/February 2000, pp. 50–57.

To construct the fluorescent structure 10 depicted in FIGS. 1A–1B and 2, the layer of quantum dots 12 is deposited on the top surface 14a of the base layer 14 and the protective layer 16 is formed over the exposed layer of quantum dots. The protective layer 16, which seals the layer of quantum dots 12 against the base layer 14, acts to protect the quantum dots 18 that may otherwise be exposed to the outside environment from damage. The layer of quantum dots 12 may be deposited on the top surface 14a of the base layer 14 by evaporation of a liquid carrier in which the quantum dots are dispersed or by providing a polymer matrix in which the quantum dots are contained on the surface. Alternatively, quantum dots 12 that can withstand high temperatures employed in injection molding can be mixed in a polymeric solution which is injection molded to form a layer of fluorescent material comprising quantum dots suspended in plastic. By employing these and other techniques, rolls of the fluorescent structure 10 hundreds of feet long could be produced for industrial and commercial use.

The fluorescent structure 10 itself may be mounted against a surface where light can be received by the top or bottom surface 16a, 14b of the fluorescent structure. Since the fluorescent structure 10 is flexible, it will conform to the contours of a curved surface, especially in the case where the fluorescent structure has a thickness less than 500 $\mu$m. The fluorescent structure 10 may also be sandwiched between two plates, wherein at least one of the plates is optically transmissive to some light absorbed by the quantum dots 18. These plate may comprise a plastic or polymeric substance such as acrylic material. Preferably, a small air gap separates each plate from the fluorescent structure 10 such that light is confined therein. Alternatively, the plates may have a lower refractive index than that of the protective layer 16 and the base 14 so as to ensure confinement of the light within the protective layer and/or base. If the fluorescent structure 10 is to be mounted in a manner where the base layer 14 or the protective layer 16 is supported against a surface having a higher refractive index, a cladding layer, i.e., a layer of material having a lower refractive index, needs to be introduced at this location to prevent the base layer or protective layer from contacting the material having a higher refractive index to ensure confinement.

In other embodiments, an optically transmissive plate, comprising for example polymeric material having a refractive index of approximately 1.5 can be abutted against the base layer 14 and/or the protective layer 16. In this configuration, the transmissive plate will act as a waveguide as long as the base and/or protective layer 14, 16 has of a similar index of refraction. Light from the fluorescent structure 10 will be coupled into the plate and guided therethrough to its edges. This plate need only have a higher refractive index than its ambient medium which might be air and/or rests on or is in contact with material having a lower refractive index. In addition, this plate is preferably optically transmissive to the light emitted by the quantum dots 18. Preferably, this plate also transmits light having suitable wavelength for pumping the quantum dots 18. This plate may comprise, for example, acrylic material. In one embodiment, two such plates are employed, one adjacent the base layer 14, and one adjacent the protective layer 16.

Figure 4:
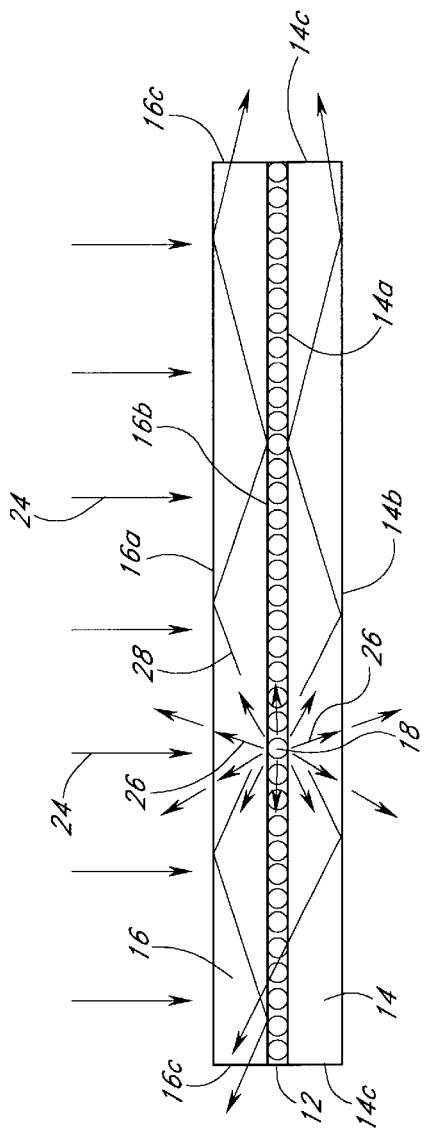
FIG. 4 is a cross-section of the fluorescent structure shown in FIGS. 1A–1B depicting the path of several rays of light emitted by a quantum dot.

As depicted in FIG. 4, light, such as sunlight, incident on the fluorescent structure 10 provides pump radiation represented by arrows 24. Such pump radiation is transmitted through the protective layer 16 to the layer of quantum dots 12. The quantum dots 18 will absorb a portion of the pump radiation, namely the light having wavelengths within its absorption band, and will produce optical emission having wavelengths corresponding to its emission band. Upon excitation by the pump radiation, the quantum dots 18 will radiate in different directions as indicated by arrows 26. Some of the optical emission radiated by the quantum dots 18 will be directed into the protective layer 16, some into the base layer 14, and some into the layer of quantum dots 12. Optical emission incident on other quantum dots 18 is likely to be absorbed by these other dots while light directed into the protective layer 16 or the base layer 14 will either escape through the top or bottom surfaces 16a, 14b respectively, or will propagate within the layers toward the edges 16c, 14c where the light can escape the fluorescent structure 10.

More specifically, optical emission from a quantum dot 18 (represented by a ray 28 shown in FIG. 4) that enters the protective layer 16 and is incident on the top surface 16a thereof at an angle measured with respect to the normal to the top surface that is larger than the critical angle will be totally internally reflected from the top surface toward the bottom surface 16b of the protective layer where it is again totally internally reflected if the light incident with respect to the normal to the bottom surface is at an angle larger than the critical angle. As a result of being totally internally reflected at the top and bottom surfaces 16a, 16b of the protective layer 16, light emitted from quantum dots 18 is trapped in this layer and guided toward the edges 16c of the fluorescent structure 10. Essentially, the protective layer 16 acts as a waveguide channeling optical emission from the quantum dots 18 toward the edges 16c of the fluorescent structure 10. Optical emission entering the base layer 14 is also guided in a similar manner toward the edges 14c. Light not trapped in the layers 14, 16 will either be absorbed in the quantum dots 18 or will exit the fluorescent structure 10 at the top or bottom surfaces 16a, 14b. Preferably, however, greater than half of the light radiated by the quantum dots 18 will be coupled into the protective and base layers 16, 14 where it will be guided to the edges 16c, 14c. Optical emission that is incident on the edges 14c, 16c at an angle measured with respect to the normal to the edges that is smaller than the critical angle will not be reflected, but rather will exit such edges. Although FIG. 4 depicts pump radiation as incident on the top 16a of the fluorescent structure 10, it will be understood that, where the base layer 14 is also substantially transparent, pump radiation incident on the bottom 14b of the fluorescent structure may similarly pump quantum dots 12 to re-radiate light.

The structure and composition of the base layer 14 and the protective layer 16 as well as the layer of quantum dots 12 should preferably facilitate the collection of pump radiation and the transport of light emitted from the quantum dots 18 to the edges 14c, 16c of the fluorescent structure 10. For example, the protective layer 16 and possibly the base layer 14 are preferably optically transparent to the pump illumination to allow this light to reach the layer of quantum dots 12. Also, the protective layer 16 and the base layer 14 are preferably optically transparent to light emitted by the quantum dots such that this light can be guided through these layers to the edges 16c, 14c of the fluorescent structure 10. Additionally, the protective layer 16 and the base layer 14 each preferably have an index of refraction, n, that is larger than air such that light emitted by the quantum dots 18 that enters into the protective layer and the base layer experiences total internal reflection and is therefore guided along these two layers to the edge 16c, 14c of a fluorescent structure 10. Furthermore, although the layer of quantum dots 14 could comprise a plurality of monolayers, the layer preferably comprises a single monolayer so as to minimize the occurrence of light emitted by a quantum dot being absorbed by another quantum dot.

In the case where the spatial extent of the surface 16a, 14b of the fluorescent structure 10 where the pump radiation is received is large compared to the light output surfaces 16c, 14c, a concentrating effect is produced, so that large amounts of light can be collected and concentrated into a smaller region. In particular, light collected, for example, by the top surface 16a of the protective layer 16 having surface area $A_{TOP}$ is transmitted to the layer of quantum dots 12. Resultant optical emission from the quantum dots 18 is coupled into the protective layer 16a and radiated out its edges 16c having a surface area, $A_{EDGE}$. If $A_{TOP} >> A_{EDGE}$ then intense emission is produced at the edges 16c, the brightness of optical emission at the edges being larger than the brightness at a given region on the layer of quantum dots 12 having surface area equal to $A_{EDGE}$.

Figure 5:
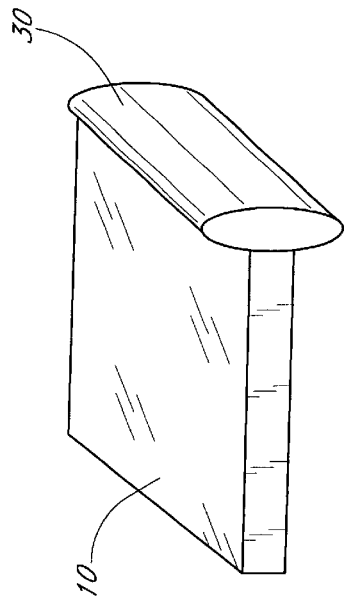
FIG. 5 is a perspective view of a fluorescent structure that includes a non-imaging optical element mounted on an edge of the structure.

Thus, the fluorescent structure 10 can be employed to create intense color illumination. Since the quantum dots 18 emit light having a narrow wavelength distribution, the light exiting at the edges 16c, 14c of the fluorescent structure 10 possesses a specific color. This color depends on the type of quantum dots 18, in particular on the size of the quantum dots. Accordingly, by employing different types of quantum dots 18, light sources of different colors can be produced. Furthermore, by stacking a first fluorescent structure 10 that includes a layer of quantum dots 12 emitting light of one color on a second fluorescent structure having a layer of quantum dots that emit light of another color, unique colors and/or patterns of colors can be created. The direction of the colored light emitted from the edges 14c, 16c of the fluorescent structure 10 can also be controlled with an optical element mounted thereon. As shown in FIG. 5, for example, a non-imaging optical element 30 can be affixed to the edges 14c, 16c of the fluorescent structure 10 so as to alter the direction the optical emission exiting the edges, limiting this emission to a specific range of angles less than 180°. In addition, highly reflective thin film with specular reflectivity preferably in excess of 95% such as for example, 3M Radiant Mirror Film, Model No. VM2000, available from 3M can be affixed to those edges from which emission is not desired.

Pump radiation may comprise natural light, i.e., sunlight, or artificial light such as from UV or blue light emitting diodes (LED) or fluorescent lights. The light incident on the fluorescent structure 10 need only comprise radiation having wavelengths within the absorption spectrum of the quantum dots 18 in the layer of quantum dots 12. Since the absorption spectrum of the quantum dots 18 comprises wavelengths shorter than the wavelength of emission from the quantum dots, the pump radiation includes wavelengths shorter than the emitted wavelengths. For example, sunlight can be employed to pump a fluorescent structure 10 having a layer of quantum dots 12 comprising CdSe particles 5.0 nm in diameter, which emit at an optical wavelength of 625 nm, since the sun radiates light across a broad spectrum including light having wavelengths at least 50 nm shorter than 625 nm. Alternatively, such a fluorescent structure 10 can be pumped with one or more light emitting diodes (LEDs) that provide light of, for example, 550 nm. Incandescent lights as well as ultraviolet light sources such as UV LEDs would also be capable of exciting the layer of quantum dots 12.

Figure 6:
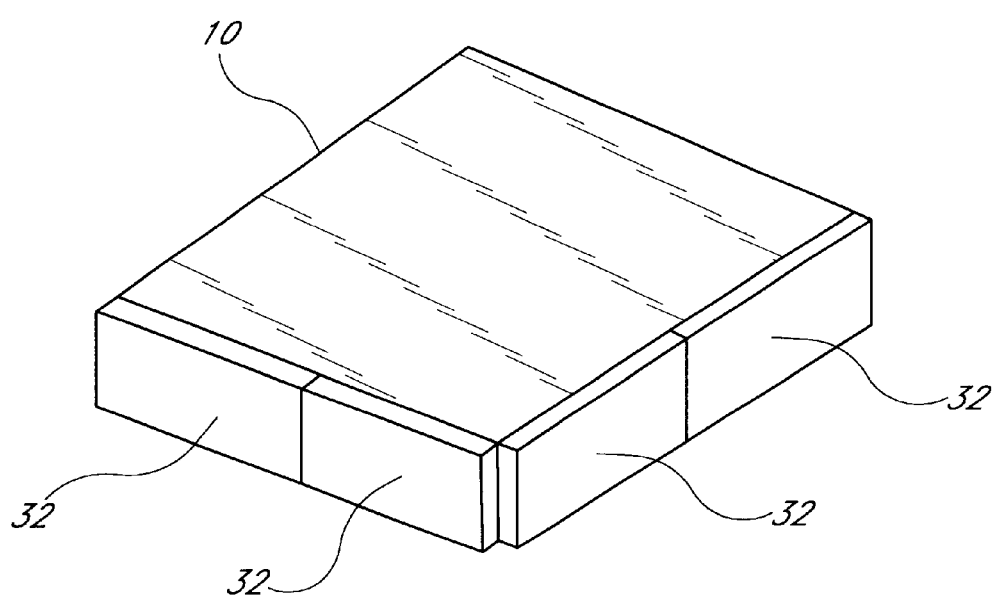
FIG. 6 is a fluorescent structure in accordance with the present invention comprising photovoltaic cells mounted on edges of the structure.

The fluorescent structure 10 described above can be employed in various applications requiring bright, narrow-band illumination. For example, light sources of colored illumination are useful in constructing signs, in creating artistic or architectural designs, and in producing bright regions of color, including outlines, bands and borders on products including but not limited to furniture, automobiles, appliances, electronics, clothes or any other object where bright color is useful for aesthetic or functional purposes. These fluorescent structures 10 are advantageously capable of producing intense colored light illumination during daytime when exposed to daylight. Thus, sunlight can be employed to power the fluorescent structure 10 described above. Since, quantum dots do not degrade with exposure to UV rays such as produced by the sun, the structure 10 has a long lifetime. By way of example, the fluorescent structure 10 can be incorporated in architectural features, such as a border to highlight a rooftop of a building during the daytime. Further, as illustrated in FIG. 6, photovoltaic solar cells 32 can be positioned at the edges 14c, 16c of the thin fluorescent structure 10 to receive narrow band illumination produced by the layer of quantum dots 12 upon exposure to sunlight. The concentrating effect of a fluorescent structure 10 having a large width and length will enhance the efficiency of generating electricity from sunlight.

Many other applications for the fluorescent structure 10 are considered possible, the relevant applications not being limited to those specifically recited above. Also, the present invention may be embodied in other specific forms without departing from the essential characteristics as described herein. The embodiments described above are to be considered in all respects as illustrative only and not restrictive in any manner.

What is claimed is:

1. An apparatus comprising:
    a layer of quantum dots, said quantum dots emitting light in response to exposure to pump radiation;
    a waveguide which receives and guides light emitted by the layer of quantum dots; and
    an upper layer which together with said waveguide sandwich said layer of quantum dots therebetween;
    wherein said waveguide, said layer of quantum dots, and said upper layer together have a thickness of less than about 500 micrometers (mm).

2. The apparatus of claim 1, wherein said quantum dots comprise particles ranging between about 2 to 10 nanometer in size.

3. The apparatus of claim 1, wherein said quantum dots essentially comprise material selected from the group consisting of cadmium selenide (CdSe), cadmium sulfide (CdS), indium arsenide (InAs), and indium phosphide (InP).

4. The apparatus of claim 1, wherein said quantum dots essentially comprise material selected from the group consisting of zinc selenide (ZnSe), and titanium dioxide (TiO2).

5. The apparatus of claim 1, wherein said layer of quantum dots comprises a monolayer of quantum dots.

6. The apparatus of claim 1, wherein said waveguide comprises polymeric material.

7. The apparatus of claim 1, wherein said layer of quantum dots is formed on said waveguide.

8. The apparatus of claim 7, wherein said upper layer comprises material that is substantially transparent to said pump radiation.

9. The apparatus of claim 8, wherein said upper layer comprises polymeric material.

10. The apparatus of claim 1, wherein said waveguide is flexible.

11. The apparatus of claim 1, further comprising a plate juxtaposed with respect to said layer of quantum dots.

12. The apparatus of claim 11, wherein said plate comprises a polymeric material.

13. The apparatus of claim 12, wherein said plate comprises acrylic.

14. The apparatus of claim 1, further comprising an additional layer of quantum dots.

15. The apparatus of claim 1, further comprising an optical element having surfaces configured to reduce angular spread of light exiting said waveguide.

16. The optical element of claim 1, further comprising a source of light that outputs pump radiation to pump said layer of quantum dots.

17. The apparatus of claim 16, wherein said source of light comprises a source selected from the group comprising a light emitting diode (LED) and a fluorescent lamp.

18. The apparatus of claim 1, further comprising a specularly reflective layer adjacent at least one side of said waveguide.

19. The apparatus of claim 1, further comprising an optical transducer having an electrical output, said device being positioned to receive light exiting said waveguide.

20. The apparatus of claim 19, wherein said optical transducer comprises a photovoltaic solar cell.

21. An apparatus comprising:
a layer of quantum dots, said quantum dots emitting light in response to exposure to pump radiation;
a waveguide which receives and guides light emitted by the layer of quantum dots; and
an optical element having surfaces configured to reduce angular spread of light exiting said waveguide.

22. The apparatus of claim 21, wherein said quantum dots comprise particles ranging between about 2 to 10 nanometers in size.

23. The apparatus of claim 21, wherein said quantum dots essentially comprise material selected from the group consisting of cadmium selenide (CdSe), cadmium sulfide (CdS), indium arsenide (InAs), and indium phosphide (InP).

24. The apparatus of claim 21, wherein said quantum dots essentially comprise material selected from the group consisting of zinc selenide (ZnSe), and titanium dioxide (TiO2).

25. The apparatus of claim 21, wherein said layer of quantum dots comprises a monolayer of quantum dots.

26. The apparatus of claim 21, wherein said waveguide comprises polymeric material.

27. The apparatus of claim 21, wherein said layer of quantum dots is formed on said waveguide.

28. The apparatus of claim 27, further comprising an upper layer which together with said waveguide sandwich said layer of quantum dots therebetween.

29. The apparatus of claim 28, wherein said upper layer comprises material that is substantially transparent to said pump radiation.

30. The apparatus of claim 29, wherein said upper layer comprises polymeric material.

31. The apparatus of claim 21, wherein said waveguide is flexible.

32. The apparatus of claim 21, further comprising a plate juxtaposed with respect to said layer of quantum dots.

33. The apparatus of claim 32, wherein said plate comprises a polymeric material.

34. The apparatus of claim 33, wherein said plate comprises acrylic.

35. The apparatus of claim 21, further comprising an additional layer of quantum dots.

36. The optical element of claim 21, further comprising a source of light that outputs pump radiation to pump said layer of quantum dots.

37. The apparatus of claim 36, wherein said source of light comprises a source selected from the group comprising a light emitting diode (LED) and a fluorescent lamp.

38. The apparatus of claim 21, further comprising a specularly reflective layer adjacent at least one side of said waveguide.

39. The apparatus of claim 21, further comprising an optical transducer having an electrical output, said device being positioned to receive light exiting said waveguide.

40. The apparatus of claim 39, wherein said optical transducer comprises a photovoltaic solar cell.

41. An apparatus comprising:
a layer of quantum dots, said quantum dots emitting light in response to exposure to pump radiation;
a waveguide which receives and guides light emitted by the layer of quantum dots; and
a specularly reflective layer adjacent at least one side of said waveguide.

42. The apparatus of claim 41, wherein said quantum dots comprise particles ranging between about 2 to 10 nanometers in size.

43. The apparatus of claim 41, wherein said quantum dots essentially comprise material selected from the group consisting of cadmium selenide (CdSe), cadmium sulfide (CdS), indium arsenide (InAs), and indium phosphide (InP).

44. The apparatus of claim 41, wherein said quantum dots essentially comprise material selected from the group consisting of zinc selenide (ZnSe), and titanium dioxide (TiO2).

45. The apparatus of claim 41, wherein said layer of quantum dots comprises a monolayer of quantum dots.

46. The apparatus of claim 41, wherein said waveguide comprises polymeric material.

47. The apparatus of claim 41, wherein said layer of quantum dots is formed on said waveguide.

48. The apparatus of claim 47, further comprising an upper layer which together with said waveguide sandwich said layer of quantum dots therebetween.

49. The apparatus of claim 48, wherein said upper layer comprises material that is substantially transparent to said pump radiation.

50. The apparatus of claim 49, wherein said upper layer comprises polymeric material.

51. The apparatus of claim 41, wherein said waveguide is flexible.

52. The apparatus of claim 41, further comprising a plate juxtaposed with respect to said layer of quantum dots.

53. The apparatus of claim 52, wherein said plate comprises a polymeric material.

54. The apparatus of claim 53, wherein said plate comprises acrylic.

55. The apparatus of claim 41, further comprising an additional layer of quantum dots.

56. The optical element of claim 41, further comprising a source of light that outputs pump radiation to pump said layer of quantum dots.

57. The apparatus of claim 56, wherein said source of light comprises a source selected from the group comprising a light emitting diode (LED) and a fluorescent lamp.

58. The apparatus of claim 41, further comprising an optical tranducer having an electrical output, said device being positioned to receive light exiting said waveguide.

59. The apparatus of claim 58, wherein said optical transducer comprises a photovoltaic solar cell.

60. An apparatus comprising:
   a layer of quantum dots, said quantum dots emmitting light in response to exposure to pump radiation;
   a wavelength which receives and guides light emitted by the layer of quantum dots;and
   an optical transducer having an electrical output, said transducer being positioned to received light exiting said waveguide;
   wherein said optical transducer comprises a photovoltaic solar cell.

61. The apparatus of claim 60, wherein said quantum dots comprise particles ranging between about 2 to 10 nanometers in size.

62. The apparatus of claim 60, wherein said quantum dots essentially comprise material selected from the group consisting of cadmium selenide (CdSe), cadmium sulfide (CdS), indium arsenide (InAs), and indium phosphide (InP).

63. The apparatus of claim 60, wherein said quantum dots essentially comprise material selected from the group consisting of zinc selenide (ZnSe), and titanium dioxide (TiO2).

64. The apparatus of claim 60, wherein said layer of quantum dots comprises a monolayer of quantum dots.

65. The apparatus of claim 60, wherein said waveguide comprises polymeric material.

66. The apparatus of claim 60, wherein said layer of quantum dots is formed on said waveguide.

67. The apparatus of claim 66, further comprising an upper layer which together with said waveguide sandwich said layer of quantum dots therebetween.

68. The apparatus of claim 67, wherein said upper layer comprises material that is substantially transparent to said pump radiation.

69. The apparatus of claim 68, wherein said upper layer comprises polymeric material.

70. The apparatus of claim 60, wherein said waveguide is flexible.

71. The apparatus of claim 60, further comprising a plate juxtaposed with respect to said layer of quantum dots.

72. The apparatus of claim 71, wherein said plate comprises a polymeric material.

73. The apparatus of claim 72, wherein said plate comprises acrylic.

74. The apparatus of claim 60, further comprising an additional layer of quantum dots.

75. The optical element of claim 60, further comprising a source of light that outputs pump radiation to pump said layer of quantum dots.

76. The apparatus of claim 75, wherein said source of light comprises a source selected from the group comprising a light emitting diode (LED) and a fluorescent lamp.

* * * * *

UNITED STATES PATENT AND TRADEMARK OFFICE
CERTIFICATE OF CORRECTION

PATENT NO. : 6,744,960 B2  
DATED : June 1, 2004  
INVENTOR(S) : David G. Pelka

It is certified that error appears in the above-identified patent and that said Letters Patent is hereby corrected as shown below:

Title page,  
Item [56], References Cited, OTHER PUBLICATIONS, "Juan C. Minano et al." reference, delete "New non-imaging desings" and insert -- New non-imaging designs -- therefor.

Column 2,  
Line 30, delete "n" and insert -- $n$ -- therefor.

Column 3,  
Line 59, delete "plate" and insert -- plates -- therefor.

Column 4,  
Line 11, delete "of".

Column 5,  
Line 22, delete "n" and insert -- $n$ -- therefor.

Column 7,  
Line 2, delete "nanometer" and insert -- nanometers -- therefor.

Column 9,  
Line 26, insert a space between "dots;" and "and".

Signed and Sealed this

Third Day of May, 2005

JON W. DUDAS  
*Director of the United States Patent and Trademark Office*